United States Patent
Shu et al.

(10) Patent No.: US 10,510,613 B2
(45) Date of Patent: Dec. 17, 2019

(54) CONTACT STRUCTURES

(71) Applicant: GLOBALFOUNDRIES INC., Grand Cayman (KY)

(72) Inventors: Jiehui Shu, Clifton Park, NY (US);
Xusheng Wu, Ballston Lake, NY (US);
Haigou Huang, Rexford, NY (US);
John H. Zhang, Altamont, NY (US);
Pei Liu, Clifton Park, NY (US);
Laertis Economikos, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/878,081

(22) Filed: Jan. 23, 2018

(65) Prior Publication Data
US 2019/0229019 A1    Jul. 25, 2019

(51) Int. Cl.
| | |
|---|---|
| H01L 21/768 | (2006.01) |
| H01L 21/8234 | (2006.01) |
| H01L 27/088 | (2006.01) |
| H01L 29/49 | (2006.01) |
| H01L 23/535 | (2006.01) |
| H01L 21/28 | (2006.01) |

(52) U.S. Cl.
CPC ............... *H01L 21/823475* (2013.01); *H01L 21/28079* (2013.01); *H01L 21/76805* (2013.01); *H01L 21/76807* (2013.01); *H01L 21/76889* (2013.01); *H01L 21/76895* (2013.01); *H01L 21/823431* (2013.01); *H01L 21/823468* (2013.01); *H01L 23/535* (2013.01); *H01L 27/0886* (2013.01); *H01L 29/4983* (2013.01)

(58) Field of Classification Search
None
See application file for complete search history.

(56) References Cited

U.S. PATENT DOCUMENTS

| | | | |
|---|---|---|---|
| 6,072,221 | A | 6/2000 | Hieda |
| 6,855,610 | B2 | 2/2005 | Tung et al. |
| 6,884,715 | B1 | 4/2005 | Kwon et al. |
| 9,905,671 | B2 * | 2/2018 | Cheng ............... H01L 29/66553 |
| 2016/0365348 | A1 | 12/2016 | Cho et al. |

(Continued)

OTHER PUBLICATIONS

Taiwanese Office Action in related TW Application No. 107112104 dated Dec. 20, 2018, 12 pages.

(Continued)

*Primary Examiner* — Minh Loan Tran
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to a contact over an active gate structure and methods of manufacture. The structure includes: an active gate structure composed of conductive material located between sidewall material; an upper sidewall material above the sidewall material, the upper sidewall material being different material than the sidewall material; and a contact structure in electrical contact with the conductive material of the active gate structure. The contact structure is located between the sidewall material and between the upper sidewall material.

18 Claims, 5 Drawing Sheets

(56) References Cited

U.S. PATENT DOCUMENTS

2017/0053997 A1     2/2017  Cheng et al.
2017/0110549 A1     4/2017  Xie et al.
2017/0148799 A1     5/2017  Basker et al.
2017/0162438 A1     6/2017  Fan et al.
2018/0012798 A1     1/2018  Labonte et al.
2018/0211875 A1*    7/2018  Basker .............. H01L 21/76897

OTHER PUBLICATIONS

German Office Action in related DE Application No. 10 2018 206 438.5 dated Oct. 23, 2018, 5 pages.
Taiwanese Office Action in related TW Application No. 107112104 dated Aug. 27, 10 pages.

* cited by examiner

CONTACT STRUCTURES

FIELD OF THE INVENTION

The present disclosure relates to semiconductor structures and, more particularly, to contact structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate back end of the line (BEOL) and middle of the line (MOL) metallization features, e.g., interconnects, due to the critical dimension (CD) scaling and process capabilities, as well as the materials that are used to fabricate such structures.

For example, to manufacture interconnect structures for active gate contacts and source/drain contacts, it is necessary to remove dielectric material above and adjacent to the gate structures. The removal of the dielectric material is provided by an etching process which also tends to erode the spacer material of the gate structure. That is, the low-k dielectric material used for the spacer or sidewalls of the gate structure can be eroded away in the downstream etching processes used to form the openings for the contacts. This loss of sidewall material will expose the metal material of the gate structure, resulting in a short between the metal material of the gate structure and the metal material used to form the contact, itself.

SUMMARY

In an aspect of the disclosure, a structure comprises: an active gate structure composed of conductive material located between sidewall material; an upper sidewall material above the sidewall material, the upper sidewall material being different material than the sidewall material; and a contact structure in electrical contact with the conductive material of the active gate structure, the contact structure being located between the sidewall material and between the upper sidewall material.

In an aspect of the disclosure, a structure comprises: a lower sidewall material formed on a substrate; an upper sidewall material above the lower sidewall material, the upper sidewall material having an etch selectivity different than the lower sidewall material; an active gate structure located between the lower sidewall material; and a contact structure in electrical contact with the active gate structure. The contact structure extends from between the upper sidewall material and into an interlevel dielectric material above the upper sidewall material.

In an aspect of the disclosure, a method comprises: forming a gate structure on a semiconductor substrate; forming a contact material adjacent to the gate structure; recessing the contact material to form a recess cavity; forming a spacer on sidewalls of the recess cavity; filling the recess cavity with a dielectric material, over the spacer; and planarizing the dielectric material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to contact structures and methods of manufacture. More specifically, the present disclosure provides contact structures over an active gate and, in embodiments, source/drain regions. Advantageously, the method of forming the contact structures avoids shorting between source/drain contacts and gate metallization features. Also, the methods disclosed herein provide a robust integration scheme to make the contact over an active gate, particularly in smaller technology nodes.

In embodiments, the contact structures can be fabricated by forming a gate structure on a semiconductor substrate, with source/drain regions. A source/drain contact layer is formed adjacent to the gate structure, which is recessed to form cavity structures over the source/drain regions. An inner spacer material, e.g., $HfO_2$, is formed on the sidewalls of the cavity structures. The cavity structures are then filled with a dielectric material (e.g., SiC), followed by planarizing of the dielectric material. Contact openings are formed in the dielectric material for the source/drain region and active gate, followed by a metal fill process within the contact openings. In embodiments, the inner spacer material (e.g., $HfO_2$) formed on the sidewalls of the contact opening will prevent shorting between the contacts and the metallization of the active gates.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures use three basic building blocks: (i) deposition of thin films of material on a substrate, (ii) applying a patterned mask on top of the films by photolithographic imaging, and (iii) etching the films selectively to the mask.

Figure 1:
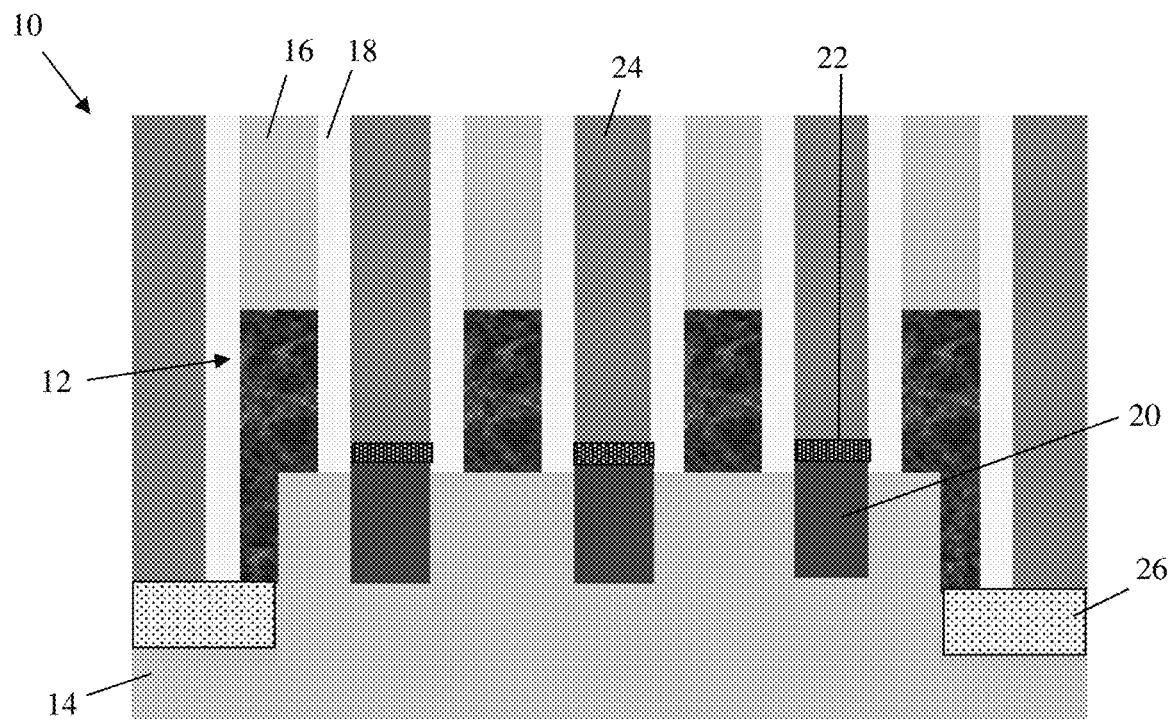
FIG. 1 shows active gate structures with source/drain regions, amongst other features, and respective fabrication processes in accordance with aspects of the present disclosure.

FIG. 1 shows active gate structures with source/drain regions, amongst other features, and respective fabrication processes in accordance with aspects of the present disclosure. In particular, the structure 10 includes a plurality of gate structures 12 formed on a substrate 14. In embodiments, the gate structures 12 can be, e.g., active metal gate structures, composed of metal material and a dielectric material. In embodiments, the metal material, e.g., conductive material, can be tungsten and other work function metals depending on the desired characteristics and/or performance of the active gate structure. The dielectric material can be a high-k dielectric material. In embodiments, the high-k dielectric gate material can be hafnium based dielectrics, as an example. In further embodiments, examples of such high-k dielectrics include, but are not limited: $Al_2O_3$, $Ta_2O_5$, $TiO_2$, $La_2O_3$, $SrTiO_3$, $LaAlO_3$, $ZrO_2$, $Y_2O_3$, $Gd_2O_3$, and combinations including multilayers thereof.

In embodiments, the gate structures 12 can be replacement gate structures formed on a planar substrate 14 or a fin structure composed of the substrate 14. In embodiments, the replacement gate fabrication process is well known such that no further explanation is required for an understanding by one of ordinary skill in the art. The substrate 14 can be any semiconductor material including, but not limited to, Si, SiGe, SiGeC, SiC, GaAs, InAs, InP, and other III/V or II/VI compound semiconductors.

The fin structure(s) can be fabricated using known sidewall imaging transfer (SIT) techniques. In the SIT technique, for example, a mandrel is formed on the substrate 14 using conventional deposition, lithography and etching processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the fin structures. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features. The sidewall spacers can then be stripped. In embodiments, the wide fin structures can also be formed during this or other patterning processes, or through other conventional patterning processes, as contemplated by the present disclosure.

Still referring to FIG. 1, the active gate structures 12 include a capping material 16 over the metal material. The capping material 16 can be a nitride material, for example, deposited using a conventional deposition process, e.g., chemical vapor deposition (CVD), followed by a planarization process for replacement gate processes. In an embodiment using a gate first process, the deposition process can be followed by a patterning process to pattern the gate material and the capping material together. In embodiments, the capping material 16 can be other materials including SiN or other materials that are resistant to subsequent etching processes.

Sidewalls or spacers 18 are provided on the sides of the active gate structures 12 and capping material 16. The spacers 18 can have a thickness of about 5 nm to about 10 nm, and a height which extends above the metal material, e.g., conductive material of the gate structure 12. The spacers 18 can be composed of any low-k dielectric material, e.g., SiOCN, SiOC, SiCN, etc. In a gate last embodiment (e.g., replacement gate process), the spacers 18 are formed by a conventional deposition process, e.g., CVD, prior to the active gate structure. The sidewalls can be deposited using a conventional deposition process followed by a patterning process, i.e., isotropic etching process.

Source and drain regions 20 are formed adjacent to the active gate structures 12. In embodiments, the source and drain regions 20 can be planar or aised epitaxial semiconductor regions formed with conventional ion implantation processes or dopant processes. Silicide contacts 22 (regions) can be formed on the source and drain regions 20. As should be understood by those of skill in the art, the silicide process begins with deposition of a thin transition metal layer, e.g., nickel, cobalt or titanium, over fully formed and patterned semiconductor devices (e.g., doped or ion implanted source and drain regions and respective devices). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 22 in the active regions of the device.

In embodiments, interlevel dielectric material 24 is provided between the gate structures 12. The interlevel dielectric material 24 can be a TEOS, which can be subjected to a planarization process, e.g., chemical mechanical polishing (CMP). STI structures 26 can also be provided adjacent to the fin structures, e.g., at ends of the fin structures. The STI structures 26 are formed in the substrate 14 using conventional lithography, etching and deposition processes, well known in the art. In embodiments, the STI structures 26 can separate the fin structures, end-to-end.

Figure 2:
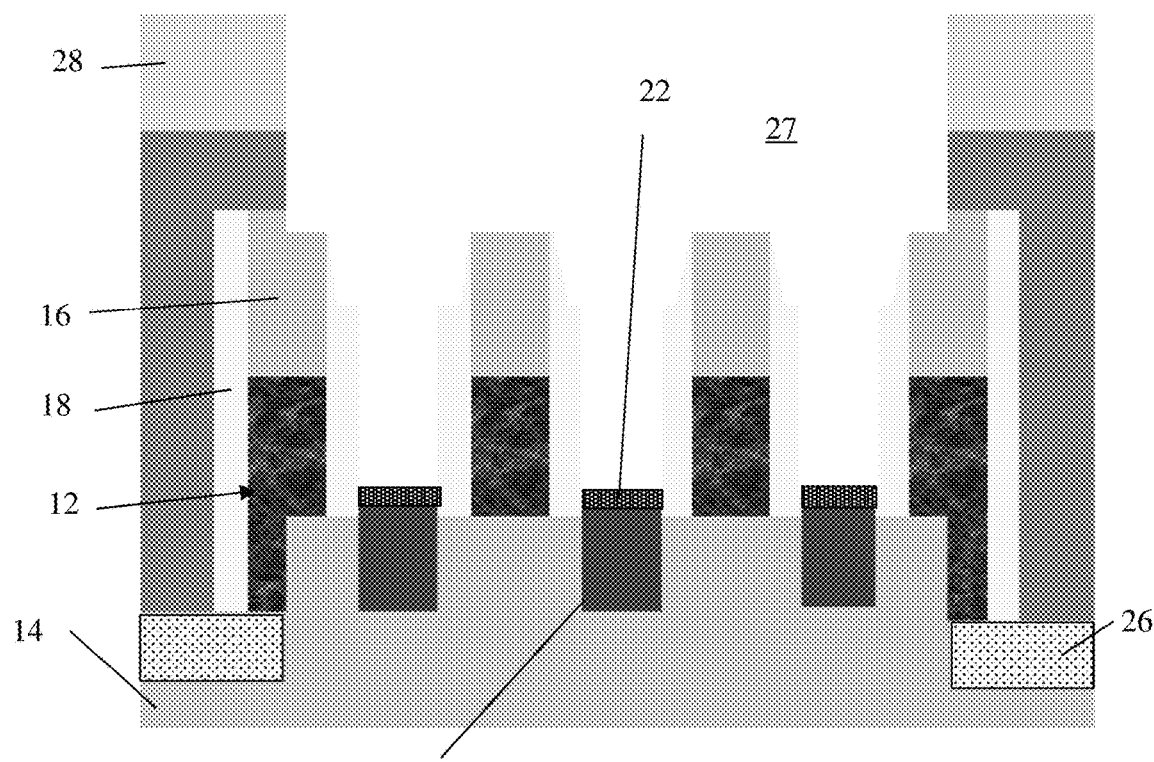
FIG. 2 shows recessed insulator material (e.g., forming a cavity structure) between adjacent active gate structures, amongst other features, and respective fabrication processes in accordance with aspects of the present disclosure.

In FIG. 2, the interlevel dielectric material 24 is removed to expose the silicide contacts 22 of the source and drain regions 20, resulting in a cavity structure 27. In embodiments, the interlevel dielectric material 24 can be removed by a conventional etching process using a resist stack 28. For example, the resist stack 28 formed over the structures defined in FIG. 1 is exposed to energy (light) to form a pattern (opening). An etching process, e.g., reactive ion etching (RIE), with a selective chemistry to the interlevel dielectric material 24 will be used to form the cavity 27 by removing the insulator material (e.g., interlevel dielectric material 24) through the openings of the resist stack 28. The etching process will expose the silicide contacts 22 of the source and drain regions 20.

Figure 3:
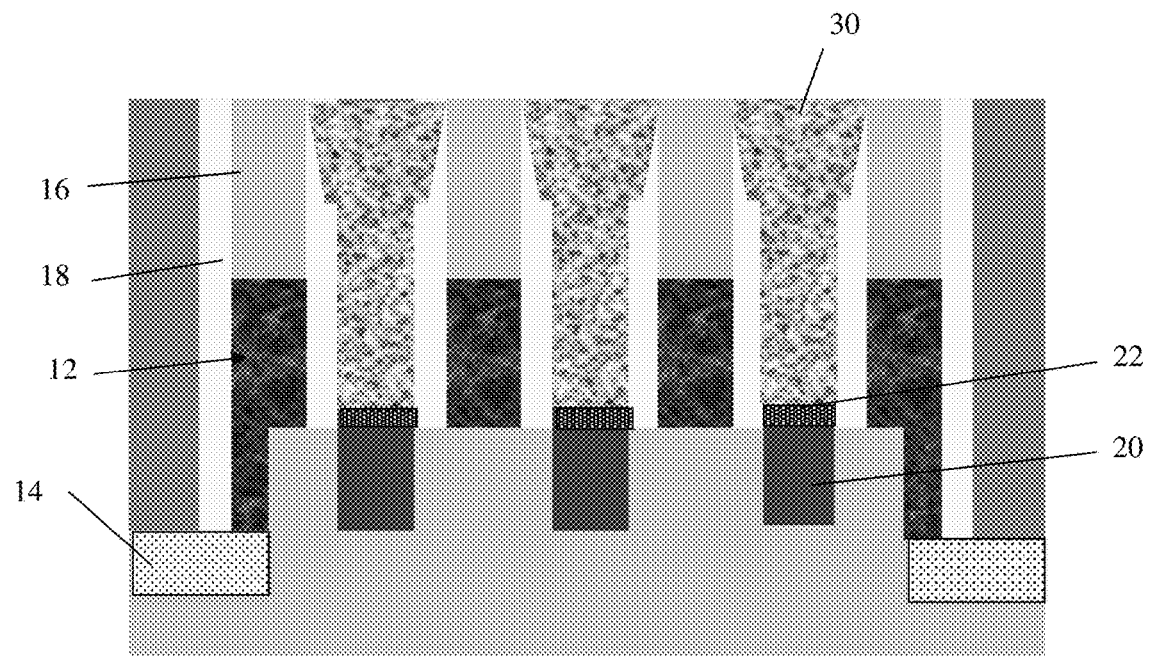
FIG. 3 shows a conductive fill material within the cavity structure, amongst other features, and respective fabrication processes in accordance with aspects of the present disclosure.

In FIG. 3, the resist stack is removed by a conventional oxygen ashing process or other known stripants, followed by a conductive fill process. In embodiments, the conductive fill process comprises the deposition of conductive material 30 in the cavity structure 27 using a conventional deposition process, e.g., chemical vapor deposition (CVD) or plating processes. In embodiments, the conductive material 30 will be self-aligned and in direct contact with the silicide contacts 22 of the source and drain regions 20.

The conductive material 30 can be any interconnect material used in semiconductor fabrication processes. For example, the conductive material 30 can be a tungsten material; although other materials such as cobalt, aluminum, etc., are also contemplated herein. Any residual material including an upper portion of the structure can be removed (e.g., planarized) by conventional chemical mechanical polishing (CMP) processes.

Figure 4:
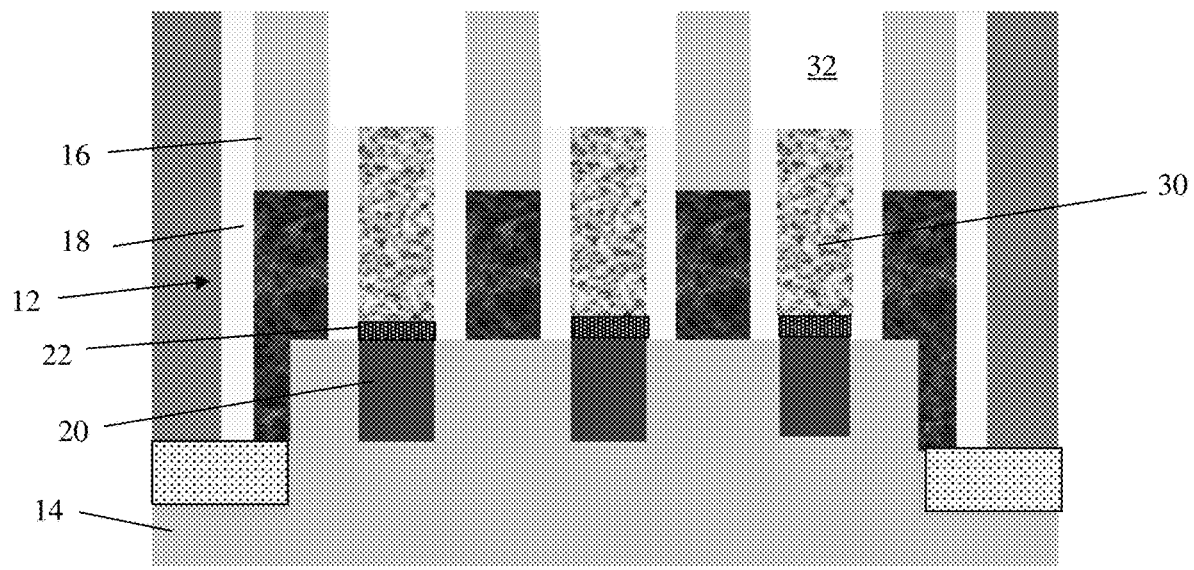
FIG. 4 shows a recessing of the conductive fill material to form an enlarged cavity structure, amongst other features, and respective fabrication processes in accordance with aspects of the present disclosure.

As shown in FIG. 4, the conductive material 30 and portions of the spacers 18 are recessed to form an enlarged cavity structure 32. As shown in FIG. 4, the lower portion of the enlarged cavity structure 32 will remain above the height of the gate structures 12, e.g., conductive material of the gate structures 12. More specifically, the conductive material 30 and portions of the spacers 18 will be recessed to a height within the extent of the capping material 16. In embodiments, the conductive material 30 can be removed by an anisotropic etching, followed by an isotropic etching of the spacers 18, e.g., spacer material.

Figure 5:
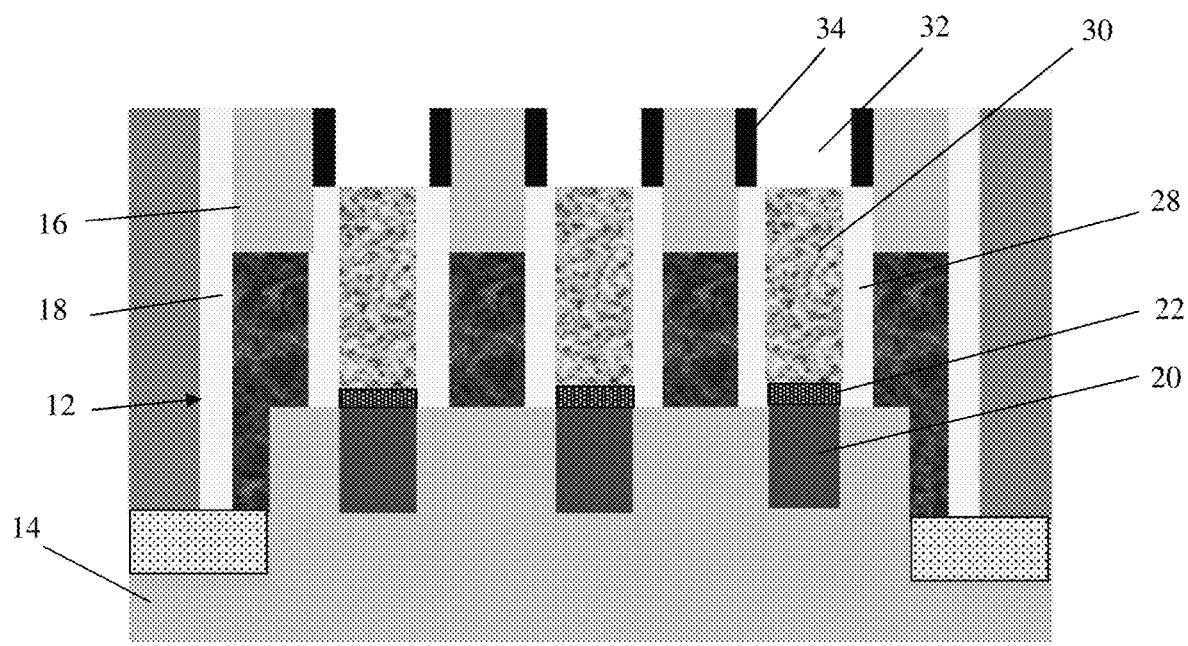
FIG. 5 shows a sidewall material lining the cavity of FIG. 4, amongst other features, and respective fabrication processes in accordance with aspects of the present disclosure.

FIG. 5 shows a sidewall material (e.g., inner spacer material) 34 lining the cavity structures 32, e.g., enlarged cavity structures. In embodiments, the sidewall material 34 can be high-k dielectric material, e.g., $HfO_2$ or other high-k dielectrics. Alternatively, the sidewall material 34 can be a metal oxide such as, e.g., $TiO_2$ or $Al_2O_3$. In any of these scenarios, it should be recognized by those of skill in the art that sidewall material 34 will have an etch selectivity to low-k materials such SiN and $SiO_2$. As the spacers 18 and capping material 16 are composed of such low-k materials, the use of the sidewall material 34, e.g., $HfO_2$, provides advantages for downstream contact formation processes as described herein.

In embodiments, the sidewall material 34 can be blanket deposited by a conventional deposition process, e.g., CVD or ALD, to a thickness of about 5 nm to about 10 nm; although other thicknesses are also contemplated herein. In embodiments, the thickness of the sidewall material 34 should be substantially equal to the thickness of the sidewall spacers 18. Following the deposition process, the sidewall material 34 will undergo an anisotropic etching process, leaving the sidewall material on the sidewalls of the cavity structures 32. It is noteworthy that the sidewall material 34 provides etching selectivity to the underlying conductive material 30 as there is no change in the recess depth during the etching of the sidewall material 34.

Figure 6:
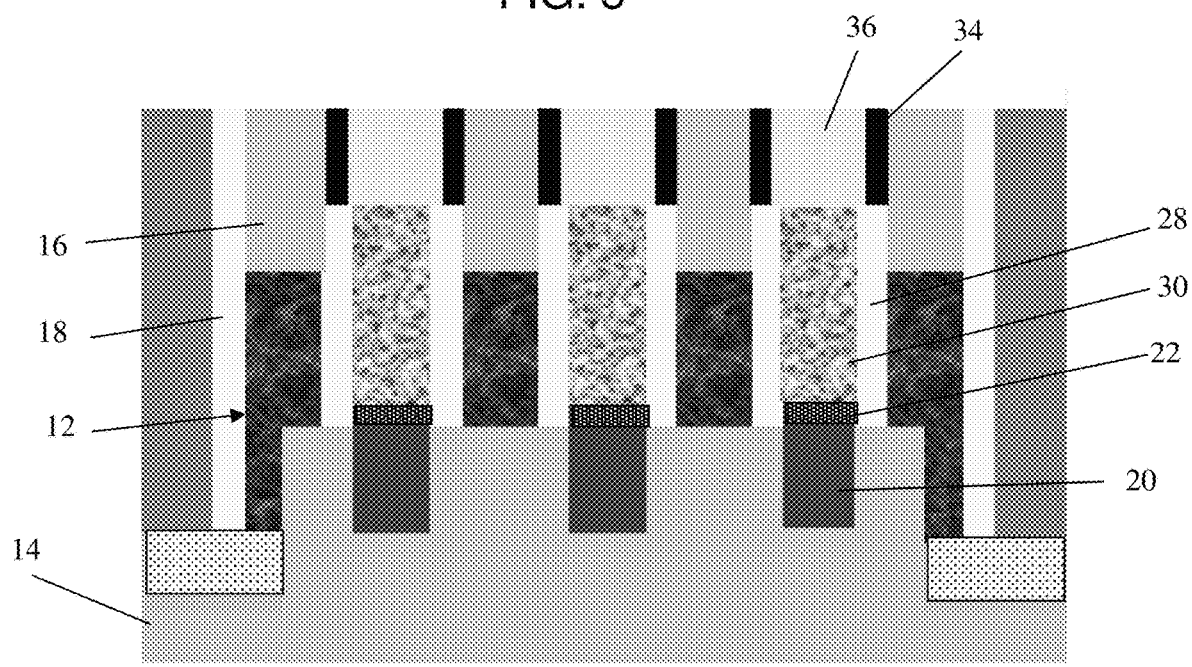
FIG. 6 shows insulator material filling the enlarged cavity structure, amongst other features, and respective fabrication processes in accordance with aspects of the present disclosure.

FIG. 6 shows insulator material 36 formed on the sidewall material 34, which further fills the remaining portions of the cavity structures 32. In embodiments, the insulator material 36 is SiC material; although other low-k dielectric materials are contemplated herein. For example, the insulator material 36 can be, e.g., SiCN or SiOC. In this way, there is etch selectivity between the high-k or metal oxide sidewall material 34 and the insulator material 36. In embodiments, the insulator material 36 can be deposited by a conventional CVD process, followed by a planarization process. In embodiments, the planarization process can remove any sidewall material of the spacers 18 that may have been damaged during the etching processes described in FIG. 5.

Figure 7A:
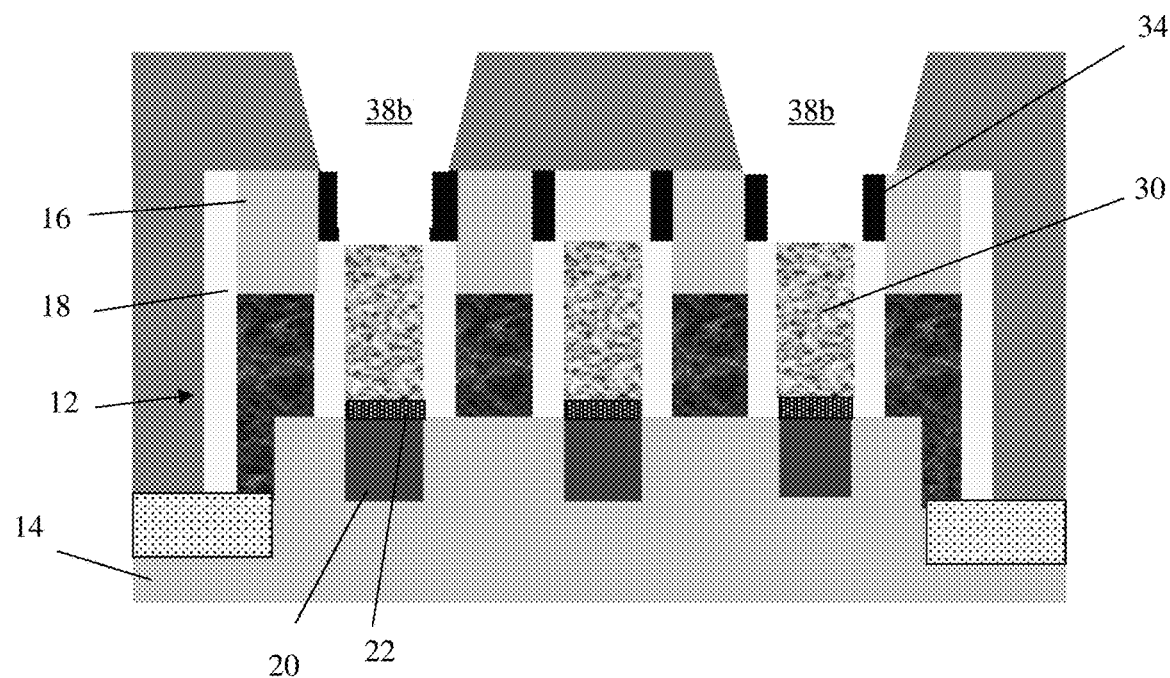
FIGS. 7A and 7B show contact openings for the active gate structure and the source/drain regions, amongst other features, and respective fabrication processes in accordance with aspects of the present disclosure.
Figure 7B:
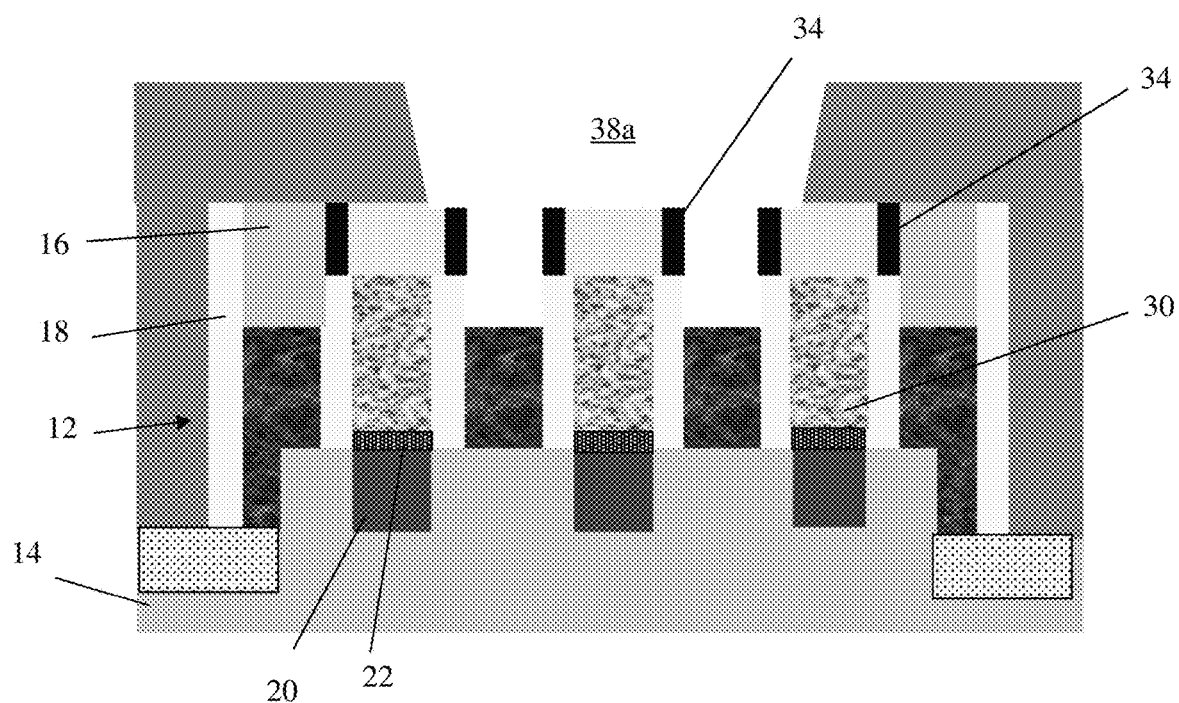

FIGS. 7A and 7B show contact openings 38a, 38b for the active gate structures 12 and the source/drain regions 20, respectively. In embodiments, prior to forming the contact openings 38a, 38b, an interlevel dielectric material 40 is deposited over the material 34 and the insulator material 36 and other exposed surfaces of the structure shown in FIG. 6. In embodiments, the contact openings 38a, 38b are then formed by conventional lithography and etching processes. In embodiments, the contact opening 38a is formed below an upper surface of the spacers 18 and will expose the metal material of the gate structures 12 (FIG. 7B); whereas, the contact opening 38b will expose the conductive material 30 that will form a contact to the source/drain regions 20 (FIG. 7A).

As should be recognized, during formation of the contact opening 38a, the capping material 16 will be removed, exposing the metal material of the gate structure 12. And, due to spacers 18 being above the metal material of the gate structures 12, the metal material will now be below the spacers 18 and below the sidewall material 34. In this way, both the spacers 18 and below the sidewall material 34 will prevent shorting of the contact material with the contact material for the source/drain regions 20.

It should be recognized by those of skill in the art that the sidewall material 34 (e.g., high-k dielectric material or metal oxide) will have an etch selectivity to the insulator material 36 (and sidewall material of the spacers 18). Accordingly, the material 34 will protect the spacers 18 during this etching process such that metal material of the gate structures 12 will not be exposed when forming the source/drain contact opening 38b. With this noted, it should now be understood by one of ordinary skill in the art that the contact material deposited into the source/drain contact openings 38b will not short to the metal material of the gate structures 12. Similarly, the contact material that is deposited into the openings 38a for the active gate structures 12 will not short to the metal material of the contact material for the source/drain regions 20. Accordingly, the use of the material will prevent contact to gate shorting.

Figure 8A:
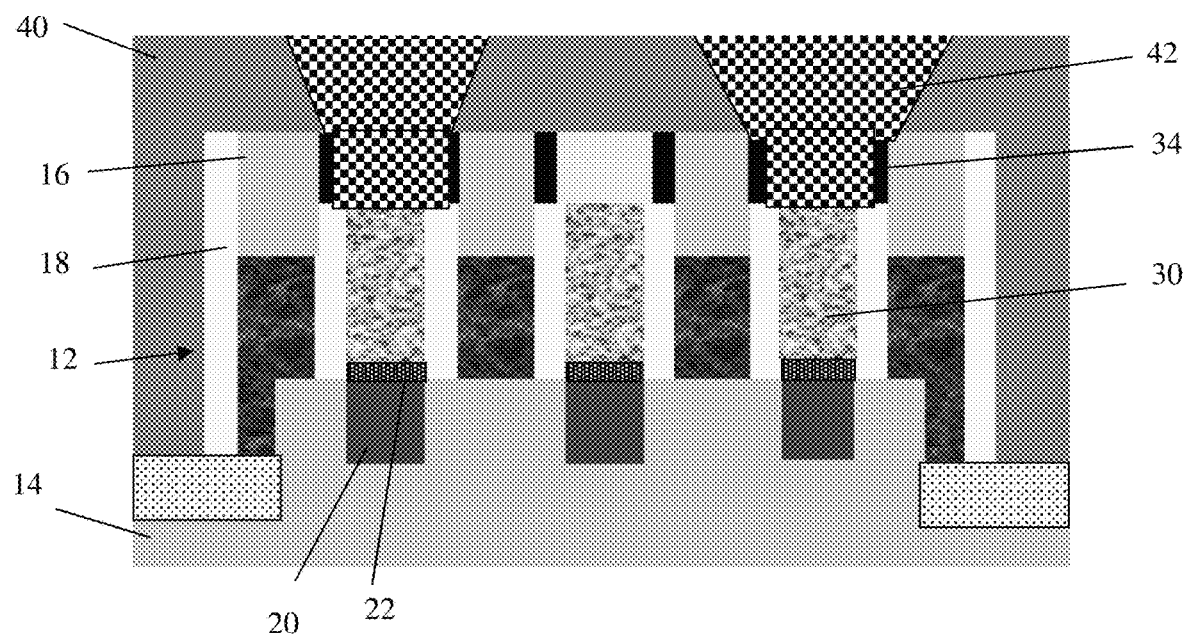
FIGS. 8A and 8B show contact material filling the contact openings, amongst other features, and respective fabrication processes in accordance with aspects of the present disclosure.
Figure 8B:
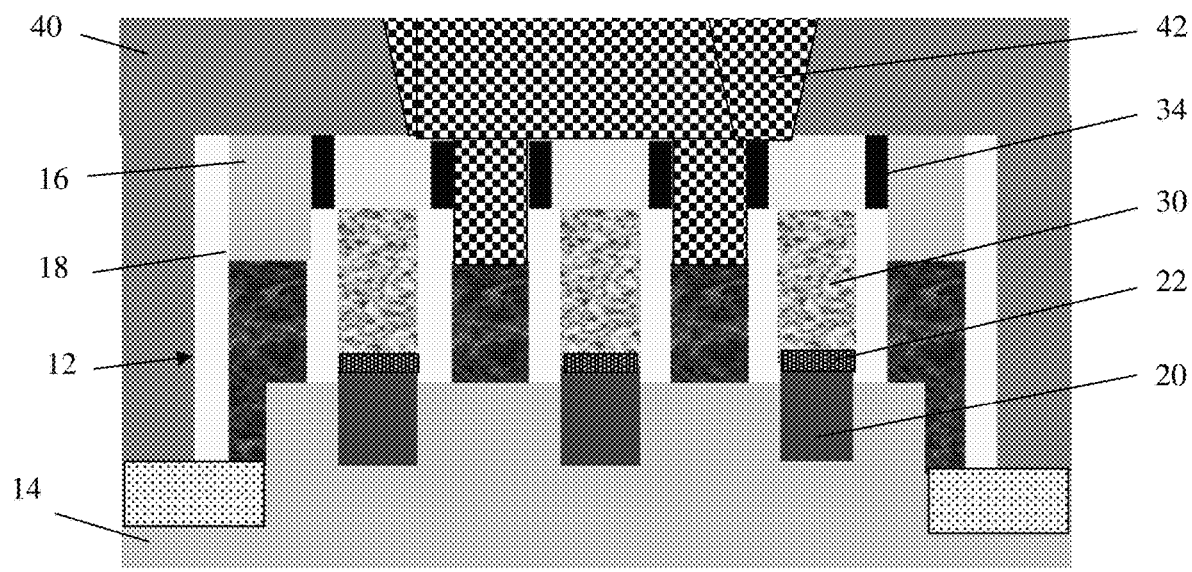

FIGS. 8A and 8B show contact metal material 42 filling the contact openings 38a, 38b. In embodiments, the contact metal material 42 can be tungsten or other contact material, e.g., aluminum, etc. The contact metal material 42 can be deposited within the contact openings 38a, 38b using a conventional deposition process, e.g., CVD, atomic layer deposition (ALD) or a plating process. In this way, the contact metal material 42 will form a contact structure in direct electrical contact with the active gate structures 12, located between the sidewall material of the spacers 18 and the upper sidewall material 34. Similarly, the contact metal material 42 will be in direct electrical contact with the silicide 22 of the source/drain region 20, located between the upper sidewall material 34. Following the deposition process, any residual metal material can be removed using a CMP process, as an example.

As should thus now be understood, FIG. 8A shows the contact material 42 in contact with the source and drain regions 20 by way of the conductive material 30 and silicide portions 22; whereas, in FIG. 8B, the contact material 42 is in contact with the gate structures 12. In both of these representations, the contact material 42 is between both the sidewall material 18 and the upper sidewall material 34. On the other hand, the (i) source and drain regions 20, conductive material 30 and silicide portions 22 are between the sidewall material 18, and (ii) the gate structure 12 is between the sidewall material 18.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
an active gate structure composed of conductive material located between sidewall material;
a source/drain region on sides of the active gate structure;
an upper sidewall material above the sidewall material, the upper sidewall material being different material than the sidewall material; and
a first contact structure in electrical contact with the conductive material of the active gate structure, the first contact structure being located between the sidewall material and between the upper sidewall material;
contact material in electrical contact with the source/drain region, the contact material being separated from active gate structure by at least the sidewall material;
a second contact structure in electrical and direct physical contact with the contact material of the source/drain region,
wherein:
the sidewall material is a low-k dielectric material and the upper sidewall material has an etch selectivity different than the low-k dielectric material;
the upper sidewall material separates the first contact structure for the active gate structure from the second contact structure of the source/drain region of the active gate structure; and
a lower portion of the second contact structure of the source/drain region is located between the sidewall material and an upper portion of the second contact structure of the source/drain region is located between and in direct physical contact with the upper sidewall material.

2. The structure of claim 1, wherein the upper sidewall material is a high-k dielectric material.

3. The structure of claim 1, wherein the upper sidewall material is a metal oxide material.

4. The structure of claim 1, wherein the second contact structure of the source/drain region is separated from the conductive material of the active gate structure by the upper sidewall material.

5. The structure of claim 4, wherein the upper sidewall material is positioned and structured to prevent shorting between the contact material of the source/drain region and the conductive material of the active gate structure.

6. The structure of claim 1, wherein the first contact structure in electrical contact with the conductive material of the active gate structure spans over the source/drain region.

7. The structure of claim 6, wherein the first contact structure and the second contact structure are composed of a same conductive material.

8. The structure of claim 7, wherein the first contact structure that spans over the source/drain region is in direct physical contact with capping material over the contact material of the source/drain region.

9. The structure of claim 8, wherein the second contact structure has vertical sidewalls in direct contact with the upper sidewall material and tapered sidewalls above the vertical sidewalls, the tapered sidewalls being in contact with interlevel dielectric material above the capping material and which also embeds the first contact structure above the upper sidewall material.

10. The structure of claim 9, wherein the capping material and the interlevel dielectric material are different materials, and the capping material is in direct physical contact with the upper sidewall material.

11. A structure comprising:
a lower sidewall material formed on a substrate;
an upper sidewall material above the lower sidewall material, the upper sidewall material having an etch selectivity different than the lower sidewall material;
an active gate structure located between the lower sidewall material; and
a contact structure in electrical contact with the active gate structure, the contact structure extending from between the upper sidewall material and into an interlevel dielectric material above the upper sidewall material, wherein:
the upper sidewall material separates the contact structure for the active gate structure from a contact structure of a source/drain region of the active gate structure;
a lower portion of the contact structure of the source/drain region is located between the lower sidewall material and an upper portion of the contact structure of the source/drain region is located in direct physical contact and between the upper sidewall material and extends into the interlevel dielectric material; and
the contact structure of the source/drain region is separated from the active gate structure by the upper sidewall material.

12. The structure of claim 11, wherein the lower sidewall material is a low-k dielectric material and the upper sidewall material is a high-k dielectric material.

13. The structure of claim 11, wherein the lower sidewall material is a low-k dielectric material and the upper sidewall material is a metal oxide material.

14. The structure of claim 11, wherein the upper sidewall material is positioned and structured to prevent shorting between the contact material of the source/drain region and the active gate structure.

15. The structure of claim 11, wherein the contact structure in electrical contact with the active gate structure spans over the source/drain region.

16. The structure of claim 15, wherein the contact structure that spans over the source/drain region is in direct physical contact with capping material over the source/drain region.

17. The structure of claim 16, wherein the contact structure of the source/drain region has vertical sidewalls in direct contact with the upper sidewall material and tapered sidewalls above the vertical sidewalls, the tapered sidewalls being in contact with interlevel dielectric material above the capping material and which also embeds the contact structure above the upper sidewall material of the active gate structure.

18. The structure of claim 17, wherein the capping material and the interlevel dielectric material are different materials, and the capping material is in direct physical contact with the upper sidewall material.

* * * * *